(12) United States Patent
Nomura et al.

(10) Patent No.: US 7,821,035 B2
(45) Date of Patent: Oct. 26, 2010

(54) ED INVERTER CIRCUIT AND INTEGRATE CIRCUIT ELEMENT INCLUDING THE SAME

(75) Inventors: Takehiko Nomura, Tokyo (JP); Hiroshi Kambayashi, Tokyo (JP); Yuki Niiyama, Tokyo (JP); Seikoh Yoshida, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 134 days.

(21) Appl. No.: 12/325,784

(22) Filed: Dec. 1, 2008

(65) Prior Publication Data
US 2009/0250767 A1    Oct. 8, 2009

Related U.S. Application Data

(63) Continuation of application No. 12/059,514, filed on Mar. 31, 2008, now abandoned.

(30) Foreign Application Priority Data
Aug. 30, 2007  (JP) ............................. 2007-224605

(51) Int. Cl.
*H01L 27/085* (2006.01)
(52) U.S. Cl. ................ 257/194; 257/392; 257/E27.061
(58) Field of Classification Search ................ 257/194, 257/392, E27.061
See application file for complete search history.

(56) References Cited
U.S. PATENT DOCUMENTS 6,670,652 B2 * 12/2003 Song .......................... 257/194
7,038,253 B2   5/2006 Yoshida et al.
2006/0157729 A1 * 7/2006 Ueno et al. ................. 257/103
2008/0173898 A1   7/2008 Ohmaki

FOREIGN PATENT DOCUMENTS

| JP | 5-47800 | 2/1993 |
|----|---------|--------|
| JP | 2001-160656 | 6/2001 |
| JP | 2004-235473 | 8/2004 |
| JP | 2006-253559 | 9/2006 |
| JP | 2007-66963 | 3/2007 |
| WO | WO 03/071607 A1 | 8/2003 |

OTHER PUBLICATIONS

Wataru Saito, et al., "Recessed-Gate Structure Approach Toward Normally Off High-Voltage AlGaN/GaN HEMT for Power Electronics Applications," IEEE Transactions on Electron Devices, vol. 53, No. 2, Feb. 2006, pp. 356-362.
Yong Cai, et al., "Monolithically Integrated Enhancement/Depletion-Mode AlGaN/GaN HEMT Inverters and Ring Oscillators Using $CF_4$ Plasma Treatment," IEEE Transactions on Electron Devices, vol. 53, No. 9, Sep. 2006, pp. 2223-2230.

* cited by examiner

Primary Examiner—Minh-Loan T Tran
Assistant Examiner—W. Wendy Kuo
(74) Attorney, Agent, or Firm—Oblon, Spivak, McClelland, Maier & Neustadt, L.L.P.

(57) ABSTRACT

A second semiconductor layer of a second nitride-based compound semiconductor with a wider bandgap formed on a first semiconductor layer of a first nitride-based compound semiconductor with a smaller bandgap includes an opening, on which a gate insulating layer is formed at a portion exposed through the opening. A first source electrode and a first drain electrode formed across a first gate electrode make an ohmic contact to the second semiconductor layer. A second source electrode and a second drain electrode formed across a second gate electrode that makes a Schottky contact to the second semiconductor layer make an ohmic contact to the second semiconductor layer.

14 Claims, 3 Drawing Sheets

ED INVERTER CIRCUIT AND INTEGRATE CIRCUIT ELEMENT INCLUDING THE SAME

This application is a continuation of U.S. application Ser. No. 12/059,514, filed on Mar. 31, 2008, the entire content of which is incorporated herein by reference. U.S. application Ser. No. 12/059,514 claims priority to Japanese application No. 2007-224605, filed Aug. 30, 2007.

BACKGROUND OF THE INVENTION

1. Field of the Invention

The present invention relates to an enhancement/depletion (ED) inverter circuit including a transistor made of a nitride-based compound semiconductor and an integrated circuit element including the ED inverter circuit.

2. Description of the Related Art

The wide bandgap semiconductors represented by III-V nitride-based compound semiconductors are appropriate materials for high-temperature, high-power, and high-frequency semiconductor devices due to their electrical characteristics including high breakdown voltage, preferable electronic transport property, and preferable thermal conductivity. For example, in a field-effect transistor (FET) having an AlGaN/GaN heterostructure, a two-dimensional electron gas is generated on a boundary of the heterostructure due to a piezoelectric effect. High electron mobility and high carrier concentration of the electron gas attract a considerable attention. Moreover, because a heterojunction field-effect transistor (HFET) having the AlGaN/GaN heterostructure has a wide band gap, low on-resistance and high switching speed, the HFET is operable in a high-temperature environment. Therefore, it is expected that an integrated circuit (IC), such as an inverter circuit, based on the nitride-based compound semiconductor can be used in a higher-temperature environment in which a conventional IC can hardly be used.

However, because of a difficulty in forming a p-type semiconductor using an ion implantation in a nitride-based semiconductor transistor, it is difficult to fabricate a complementary metal-oxide semiconductor (CMOS) device. As a result, it is necessary to use an enhancement/depletion (ED) inverter circuit as a basic unit. An ED inverter circuit formed with an enhancement-type high electron mobility transistor (HEMT) and a depletion-type HEMT is disclosed in, for example, "Recessed-Gate Structure Approach Toward Normally Off High-Voltage AlGaN/GaN HEMT for Power Electronics Application", Wataru Saito, et al., IEEE Transactions on Electron Devices. vol. 53, No. 2, pp. 356-362, 2006 (hereinafter, "a first literature") and "Monolithically Integrated Enhancement/Depletion-Mode AlGaN/GaN HEMT Inverters and Ring Oscillators Using $CF_4$ Plasma Treatment", Yong Cai, et al., IEEE Transactions on Electron Devices. vol. 53, No. 9, pp. 2223-2230, 2006 (hereinafter, "a second literature"). However, the HEMTs are basically the depletion-type HEMTs. In the first literature, the enhancement-type HEMT is formed by recess-etching an AlGaN layer that is formed under a gate electrode. In the second literature, the enhancement-type HEMT is formed by doping fluorine as an n-type dopant in the AlGaN layer that is formed under the gate electrode.

However, in the HEMT disclosed in the first literature, because a thickness of the AlGaN layer is decreased due to the recess-etching of the AlGaN layer, the electrical characteristics of the electron gas is degraded. Moreover, because the AlGaN layer having hard crystal structure is thin, it is difficult to obtain a desired recess depth by the recess-etching. Therefore, it is difficult to obtain a desired threshold voltage because the threshold voltage of the HEMT depends on the recess depth. In the HEMT disclosed in the second literature, the fluorine is doped in the AlGaN layer by using a plasma treatment in a relatively low temperature environment. Accordingly, a fluorine diffusion is likely to happen particularly when the HEMT is used at a high temperature, which can degrade reliability of the HEMT.

SUMMARY OF THE INVENTION

It is an object of the present invention to at least partially solve the problems in the conventional technology.

According to an aspect of the present invention, there is provided an enhancement/depletion inverter circuit including a first semiconductor layer formed with a first nitride-based compound semiconductor with a smaller bandgap on a substrate; a second semiconductor layer formed with a second nitride-based compound semiconductor with a wider bandgap on the first semiconductor layer, the second semiconductor layer including a first opening at a predetermined position; a gate insulating layer formed on a portion of the first semiconductor layer exposed through the first opening; a first gate electrode formed on the gate insulating layer; a first source electrode and a first drain electrode formed at predetermined positions on the second semiconductor layer across the first gate electrode, the first source electrode and the first drain electrode making an ohmic contact to the second semiconductor layer; a second gate electrode formed on the second semiconductor layer, the second gate electrode making a Schottky contact to the second semiconductor layer; and a second source electrode and a second drain electrode formed at predetermined positions on the second semiconductor layer across the second gate electrode, the second source electrode and the second drain electrode making an ohmic contact to the second semiconductor layer.

Furthermore, according to another aspect of the present invention, there is provided an enhancement/depletion inverter circuit including a first semiconductor layer formed with a first nitride-based compound semiconductor with a smaller bandgap on a substrate; a second semiconductor layer formed with a second nitride-based compound semiconductor with a wider bandgap on the first semiconductor layer, the second semiconductor layer including a first opening at a predetermined position; a third semiconductor layer formed with a third nitride-based compound semiconductor using an epitaxial growth on a portion of the first semiconductor layer exposed through the first opening; a gate insulating layer formed on the third semiconductor layer; a first gate electrode formed on the gate insulating layer; a first source electrode and a first drain electrode formed at predetermined positions on the second semiconductor layer across the first gate electrode, the first source electrode and the first drain electrode making an ohmic contact to the second semiconductor layer; a second gate electrode formed on the second semiconductor layer, the second gate electrode making a Schottky contact to the second semiconductor layer; and a second source electrode and a second drain electrode formed at predetermined positions on the second semiconductor layer across the second gate electrode, the second source electrode and the second drain electrode making an ohmic contact to the second semiconductor layer.

Moreover, according to a still another aspect of the resent invention, there is provided an integrated circuit element including an enhancement/depletion inverter circuit including a first semiconductor layer formed with a first nitride-based compound semiconductor with a smaller bandgap on a substrate, a second semiconductor layer formed with a second nitride-based compound semiconductor with a wider bandgap on the first semiconductor layer, the second semiconductor layer including a first opening at a predetermined position, a gate insulating layer formed on a portion of the first semiconductor layer exposed through the first opening, a first gate electrode formed on the gate insulating layer, a first source electrode and a first drain electrode formed at predetermined positions on the second semiconductor layer across the first gate electrode, the first source electrode and the first drain electrode making an ohmic contact to the second semiconductor layer, a second gate electrode formed on the second semiconductor layer, the second gate electrode making a Schottky contact to the second semiconductor layer, and a second source electrode and a second drain electrode formed at predetermined positions on the second semiconductor layer across the second gate electrode, the second source electrode and the second drain electrode making an ohmic contact to the second semiconductor layer.

Furthermore, according to still another aspect of the present invention, there is provided an integrated circuit element including an enhancement/depletion inverter circuit that includes a first semiconductor layer formed with a first nitride-based compound semiconductor with a smaller bandgap on a substrate, a second semiconductor layer formed with a second nitride-based compound semiconductor with a wider bandgap on the first semiconductor layer, the second semiconductor layer including a first opening at a predetermined position, a third semiconductor layer formed with a third nitride-based compound semiconductor using an epitaxial growth on a portion of the first semiconductor layer exposed through the first opening, a gate insulating layer formed on the third semiconductor layer, a first gate electrode formed on the gate insulating layer, a first source electrode and a first drain electrode formed at predetermined positions on the second semiconductor layer across the first gate electrode, the first source electrode and the first drain electrode making an ohmic contact to the second semiconductor layer, a second gate electrode formed on the second semiconductor layer, the second gate electrode making a Schottky contact to the second semiconductor layer, and a second source electrode and a second drain electrode formed at predetermined positions on the second semiconductor layer across the second gate electrode, the second source electrode and the second drain electrode making an ohmic contact to the second semiconductor layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are described in detail below with reference to the accompanying drawings.

Figure 1:
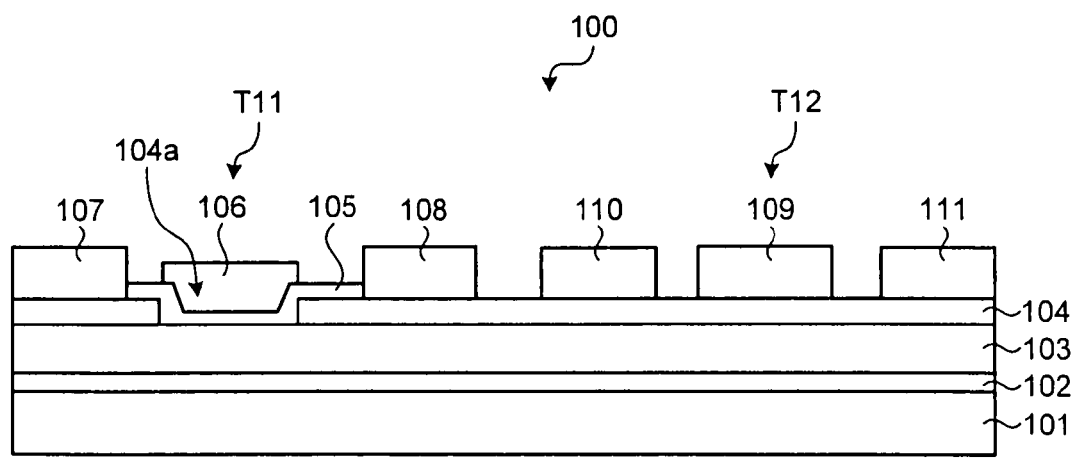
FIG. 1 is a side view of an ED inverter circuit according to a first embodiment of the present invention.

FIG. 1 is a side view of an ED inverter circuit 100 according to a first embodiment of the present invention. The ED inverter circuit 100 includes a substrate 101 made of a material such as sapphire, SiC, or silicon. On the substrate 101, a buffer layer 102 formed with an AlN layer and a GaN layer that are grown alternately, a p-GaN layer 103, and an AlGaN layer 104 are sequentially formed. The AlGaN layer 104 includes an opening 104a at a predetermined position.

A bandgap of AlGaN is wider than a bandgap of p-GaN. Consequently, a two-dimensional electron gas is generated in the p-GaN layer 103 near a boundary with the AlGaN layer 104.

A gate insulating layer 105 made of $SiO_2$ is formed on a portion of the p-GaN layer 103 exposed through the opening 104a. A gate electrode 106 is formed on the gate insulating layer 105. A source electrode 107 and a drain electrode 108 are formed on the AlGaN layer 104 across the gate electrode 106. The source electrode 107 and the drain electrode 108 make an ohmic contact to the AlGaN layer 104. Thus, the p-GaN layer 103, the AlGaN layer 104, the gate insulating layer 105, the gate electrode 106, the source electrode 107, and the drain electrode 108 that are formed on the substrate 101 with the buffer layer 102 integrally form a transistor T11 that is an enhancement-type metal oxide semiconductor field effect transistor (E-MOSFET).

A gate electrode 109 is formed in an area on the AlGaN layer 104 near the transistor T11. The gate electrode 109 makes a Schottky contact to the AlGaN layer 104. A source electrode 110 and a drain electrode 111 are formed on the AlGaN layer 104 across the gate electrode 109. The source electrode 110 and the drain electrode 111 make an ohmic contact to the AlGaN layer 104. Thus, the p-GaN layer 103, the AlGaN layer 104, the gate electrode 109, the source electrode 110, and the drain electrode 111 that are formed on the substrate 101 with the buffer layer 102 integrally form a transistor T12 that is a depletion-type HEMT.

Both the transistor T11 and the transistor T12 are formed on the same substrate, and wired to each other appropriately to form the ED inverter circuit 100.

In the ED inverter circuit 100, threshold voltage characteristics of the transistor T11 can be adjusted to a desired value by precisely controlling a thickness of the gate insulating layer 105 and a carrier concentration of the p-GaN layer 103. The thickness of the gate insulating layer 105 and the carrier concentration of the p-GaN layer 103 hardly fluctuate even at a high temperature, for example, about 200° C. Accordingly, it is possible to obtain the ED inverter circuit 100 with high controllability and high reliability at the high temperature.

Moreover, because a MOSFET is used as the transistor T11, a forward current does not flow up to threshold voltage in the forward direction. This allows the threshold voltage to be set to a higher level.

Given below is an explanation about a method of fabricating the ED inverter circuit 100. Firstly, the buffer layer 102, the p-GaN layer 103, and the AlGaN layer 104 are sequentially grown on the substrate 101 using, for example, a metalorganic chemical vapor deposition (MOCVD). A dopant that is doped in the p-GaN layer 103 is, for example, Mg. A doping concentration of Mg is set to a value within a range, for example, from $5 \times 10^{15}$ $cm^{-3}$ to $1 \times 10^{17}$ $cm^{-3}$ so that the transistor T11 can obtain the desired threshold value. The doping concentration can be easily adjusted by controlling a flow rate of a material gas containing Mg such as biscyclopentadienyl magnesium (Cp$_2$Mg).

Secondly, the AlGaN layer 104 is patterned using a photolithographic technique. The AlGaN layer 104 is masked based on the pattern, and a predetermined part of the AlGaN layer 104 is removed by etching. Thus, the opening 104a is formed on the AlGaN layer 104. It is preferable to use a dry etching, for example, an inductively coupled plasma (ICP) etching.

Thirdly, an SiO$_2$ layer is deposited on the entire surface of the substrate to form the gate insulating layer 105. A thickness of the SiO$_2$ layer is, for example, about 50 nm so that the transistor T11 can obtain a desired threshold voltage. The thickness of the SiO$_2$ layer can be easily adjusted by controlling, for example, a deposition time. After the SiO$_2$ layer is formed, the substrate is annealed in an N$_2$ atmosphere at 900° C. to reduce an interface state between the p-GaN layer 103 and the SiO$_2$ layer. An unnecessary part of the SiO$_2$ layer is removed excluding an area on which the gate electrode 109 is to be formed by photolithographic patterning and etching.

Fourthly, polysilicon is deposited on the entire surface of the substrate. The polysilicon is to be a gate electrode. The polysilicon is doped with P by annealing the substrate within a furnace at 900° C. for twenty minutes in a POCl$_3$ atmosphere, to obtain n$^+$-type polysilicon. After that, photolithographic patterning is performed to form a gate area, and an unnecessary part of the polysilicon is removed by reactive ion etching (RIE). Thus, the gate electrodes 106 and 109 are formed.

Fifthly, the source electrodes 107 and 110 and the drain electrodes 108 and 111 are formed, and finally the transistors T11 and T12 are formed. The source electrodes 107 and 110 and the drain electrodes 108 and 111 are made of metals such as Ti/Al or Ti/AlSi/Mo to make an ohmic contact. The ED inverter circuit 100 is completed by wiring the transistors T11 and T12 to each other as appropriately.

As described above, the ED inverter circuit 100 according to the first embodiment has high controllability and high reliability at the high temperature.

An ED inverter circuit 200 according to a second embodiment of the present invention is described below. The structure of the ED inverter circuit 200 is similar to that of the ED inverter circuit 100 except that the ED inverter circuit 200 includes a cap layer having a high carrier concentration between the AlGaN layer and each of the source electrodes and the drain electrodes.

Figure 2:
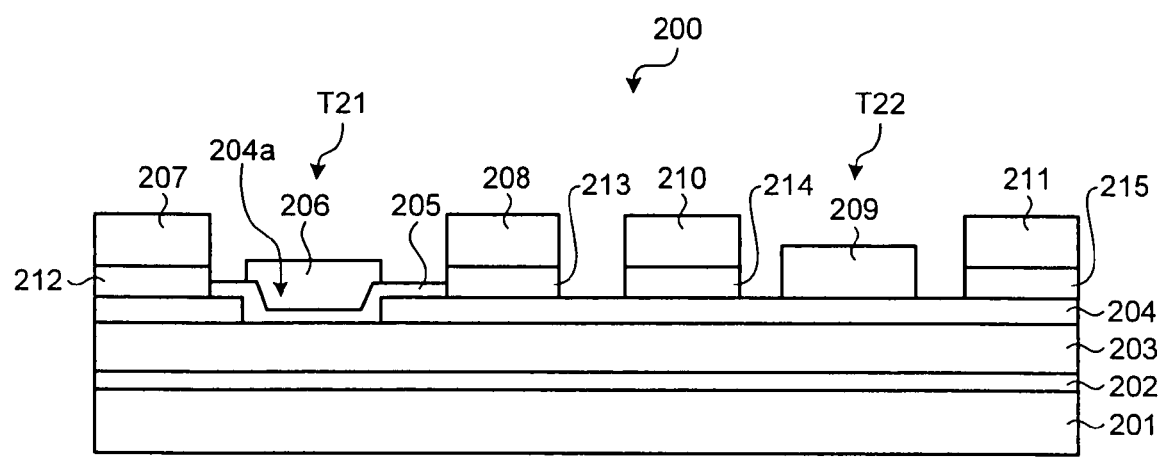
FIG. 2 is a side view of an ED inverter circuit according to a second embodiment of the present invention.

FIG. 2 is a side view of the ED inverter circuit 200. The ED inverter circuit 200 includes transistors T21 and T22 on a substrate 201 with a buffer layer 202 in the same manner as the transistors T11 and T12 of the ED inverter circuit 100. The transistor T21 is an enhancement-type MOSFET and the transistor T22 is a depletion-type HEMT. The transistor T21 includes a p-GaN layer 203, an AlGaN layer 204 including an opening 204a, a gate insulating layer 205, a gate electrode 206, a source electrode 207, a drain electrode 208, an n$^+$-GaN layer 212 formed between the AlGaN layer 204 and the source electrode 207, and an n$^+$-GaN layer 213 formed between the AlGaN layer 204 and the drain electrode 208.

The transistor T22 includes the p-GaN layer 203, the AlGaN layer 204, a gate electrode 209, a source electrode 210, a drain electrode 211, an n$^+$-GaN layer 214 formed between the AlGaN layer 204 and the source electrode 210, and an n$^+$-GaN layer 215 formed between the AlGaN layer 204 and the drain electrode 211.

The ED inverter circuit 200 includes the n$^+$-GaN layers 212 to 215 that have a high carrier concentration between the AlGaN layer 204 and the source electrode 207, 210 or the drain electrodes 208, 211, which decreases a contact resistance between the AlGaN layer 204 and each of the electrodes 207, 208, 210, and 211 and therefore reduces the on-resistance.

The ED inverter circuit 200 can be fabricated in the same manner as used in the ED inverter circuit 100. Given below is an explanation about a method of forming the n$^+$-GaN layers 212 to 215. After the AlGaN layer 204 is epitaxially grown, an n$^+$-GaN layer is epitaxially grown on the substrate. The n$^+$-GaN layer is patterned using a photolithographic technique, and a predetermined part of the n$^+$-GaN layer is then removed by etching. Thus, the n$^+$-GaN layers 212 to 215 are formed. A dopant that is doped in the n$^+$-GaN layer can be, for example, silicon. A doping concentration is, for example, about $1\times10^{19}$ cm$^{-3}$.

An ED inverter circuit 300 according to a third embodiment of the present invention is described below. The structure of the ED inverter circuit 300 is similar to that of the ED inverter circuit 100 except that the ED inverter circuit 300 includes an undope-GaN layer formed on the buffer and a p-GaN layer formed on a portion of the undope-GaN layer exposed through the opening of the AlGaN layer.

Figure 3:
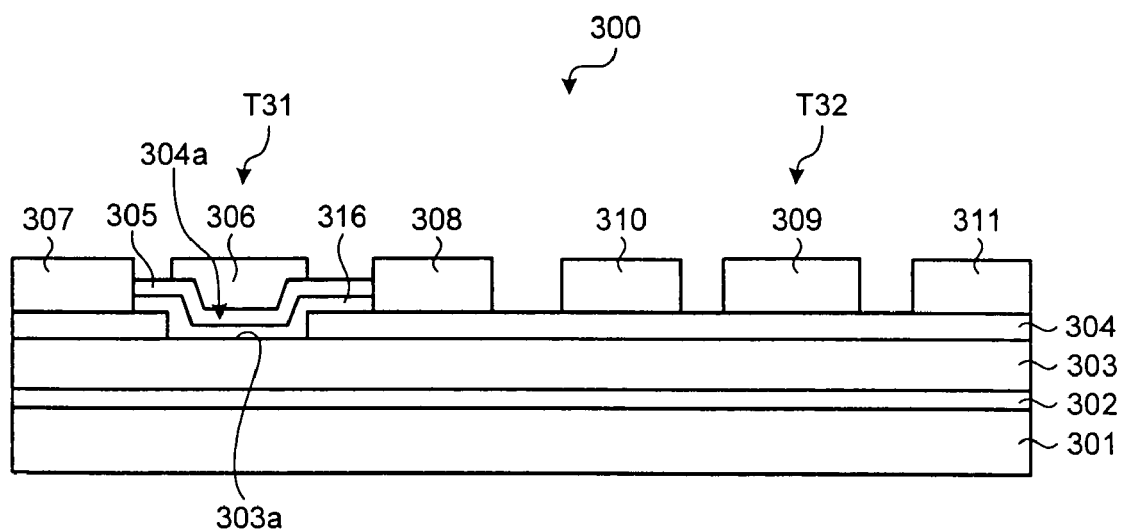
FIG. 3 is a side view of an ED inverter circuit according to a third embodiment of the present invention.

FIG. 3 is a side view of the ED inverter circuit 300. The ED inverter circuit 300 includes transistors T31 and T32 on a substrate 301 with a buffer layer 302 in the same manner as the transistors T11 and T12 of the ED inverter circuit 100. The transistor T31 is an enhancement-type MOSFET and the transistor T32 is a depletion-type HEMT. The transistor T31 includes an undope-GaN layer 303, an AlGaN layer 304 including an opening 304a, a gate insulating layer 305, a gate electrode 306, a source electrode 307, a drain electrode 308, and a p-GaN layer 316. The p-GaN layer 316 is formed on a surface portion 303a of the undope-GaN layer 303 exposed through the opening 304a of the AlGaN layer 304 by epitaxial growth. The gate insulating layer 305 is formed on the p-GaN layer 316.

The transistor T32 includes the undope-GaN layer 303, the AlGaN layer 304, a gate electrode 309, a source electrode 310, and a drain electrode 311.

A surface crystallinity of the p-GaN layer 316 of the transistor T31 is excellent because the p-GaN layer 316 is formed by epitaxial growth. The gate insulating layer 305 is formed not directly on the surface portion 303a of the undope-GaN layer 303 but on the p-GaN layer 316 having the preferable surface crystallinity. Therefore, if the surface portion 303a becomes rough and its crystallinity is degraded during etching for forming the opening 304a on the AlGaN layer 304, it is possible to obtain excellent quality of the boundary between the GaN/oxide layers. This results in preventing channel mobility of the transistor T31 from decreasing.

The transistor T32 that is a HEMT has high electron-gas mobility because of a low impurity concentration of the undope-GaN layer 303 that generates the electron gas layer by acting with the AlGaN layer 304. As a result, the ED inverter circuit 300 can operate at high speed.

The ED inverter circuit 300 can be fabricated in the same manner as used in the ED inverter circuit 100. Given below is an explanation about a method of forming the p-GaN layer 316. After the opening 304a is formed on the AlGaN layer 304, a p-GaN layer is epitaxially grown on the entire surface of the substrate. The p-GaN layer is patterned using a photolithographic technique, and a predetermined part of the p-GaN layer is then removed by etching. Thus, the p-GaN layer 316 is formed.

An ED inverter circuit 400 according to a fourth embodiment of the present invention is described below. The structure of the ED inverter circuit 400 is similar to that of the ED inverter circuit 100 except that the ED inverter circuit 400 includes an undope-GaN layer between the p-GaN layer and the AlGaN layer.

Figure 4:
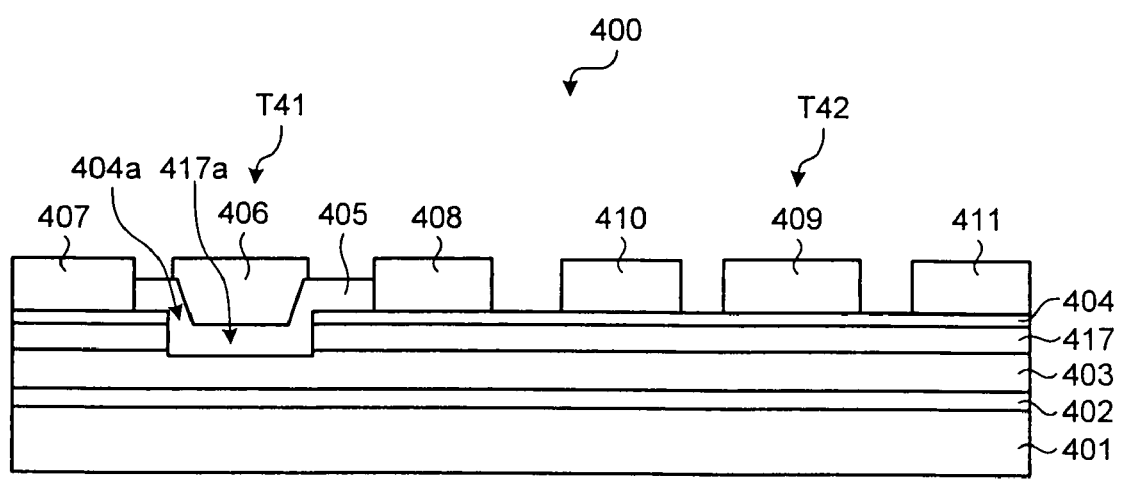
FIG. 4 is a side view of an ED inverter circuit according to a fourth embodiment of the present invention.

FIG. 4 is a side view of the ED inverter circuit 400. The ED inverter circuit 400 includes transistors T41 and T42 on a substrate 401 with a buffer layer 402 in the same manner as the transistors T11 and T12 of the ED inverter circuit 100. The transistor T41 is an enhancement-type MOSFET and the transistor T42 is a depletion-type HEMT. The transistor T41 includes a p-GaN layer 403, an AlGaN layer 404 including an opening 404a, a gate insulating layer 405, a gate electrode 406, a source electrode 407, a drain electrode 408, and an undope-GaN layer 417 that is formed between the p-GaN layer 403 and the AlGaN layer 404. The undope-GaN layer 417 includes an opening 417a overlapped with the opening 404a of the AlGaN layer 404. The gate insulating layer 405 is formed on a portion of the p-GaN layer 403 exposed through the openings 404a and 417a.

The transistor T42 includes the p-GaN layer 403, the undope-GaN layer 417, the AlGaN layer 404, a gate electrode 409, a source electrode 410, and a drain electrode 411.

In the ED inverter circuit 400, in the same manner as the ED inverter circuit 300, the undope-GaN layer 417 on which the electron gas layer is generated by reacting with the AlGaN layer has low impurity concentration. Therefore, the transistor T42 that is a HEMT can obtain high electron-gas mobility. As a result, the ED inverter circuit 400 can operate at high speed.

An ED inverter circuit 500 according to a fifth embodiment of the present invention is described below. The structure of the ED inverter circuit 500 is similar to that of the ED inverter circuit 100 except that the ED inverter circuit 500 includes a spacer layer made of AlN between the p-GaN layer and the AlGaN layer.

Figure 5:
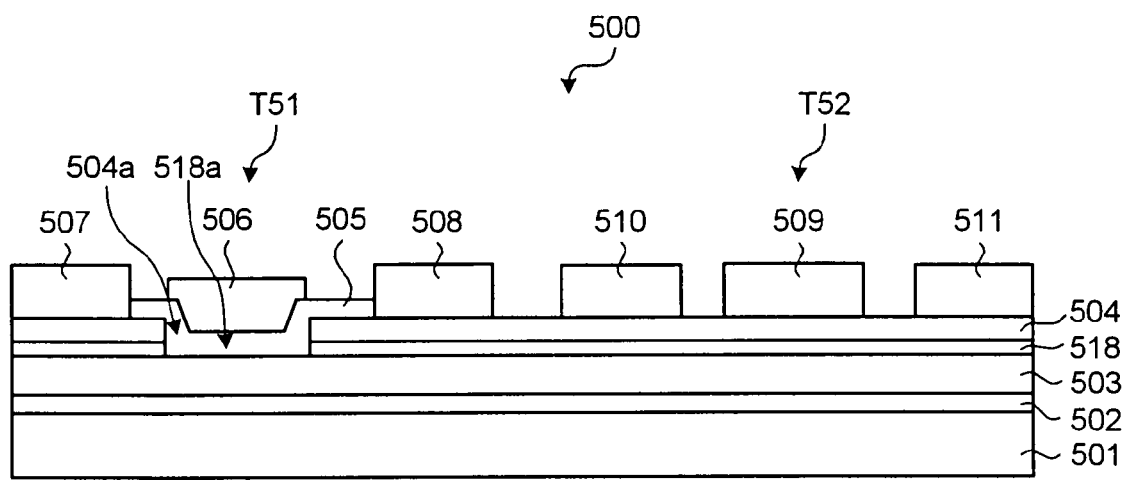
FIG. 5 is a side view of an ED inverter circuit according to a fifth embodiment of the present invention.

FIG. 5 is a side view of the ED inverter circuit 500. The ED inverter circuit 500 includes transistors T51 and T52 on a substrate 501 with a buffer layer 502 in the same manner as the transistors T11 and T12 of the ED inverter circuit 100. The transistor T51 is an enhancement-type MOSFET and the transistor T52 is a depletion-type HEMT. The transistor T51 includes a p-GaN layer 503, an AlGaN layer 504 including an opening 504a, a gate insulating layer 505, a gate electrode 506, a source electrode 507, a drain electrode 508, and a spacer layer 518 that is made of AlN and formed between the p-GaN layer 503 and the AlGaN layer 504. The spacer layer 518 includes an opening 518a overlapped with the opening 504a of the AlGaN layer 504. The gate insulating layer 505 is formed on a portion of the p-GaN layer 503 exposed through the openings 504a and 518a.

The transistor T52 includes the p-GaN layer 503, the spacer layer 518, the AlGaN layer 504, a gate electrode 509, a source electrode 510, and a drain electrode 511.

In the ED inverter circuit 500, because of the presence of the spacer layer 518 that is made of AlN, a band offset between the p-GaN layer 503 and the AlGaN layer 504 increases and a piezoelectric effect becomes stronger, which increases the mobility of the electron gas that is generated on the p-GaN layer 503. As a result, the ED inverter circuit 500 can operate at high speed.

Figure 6:
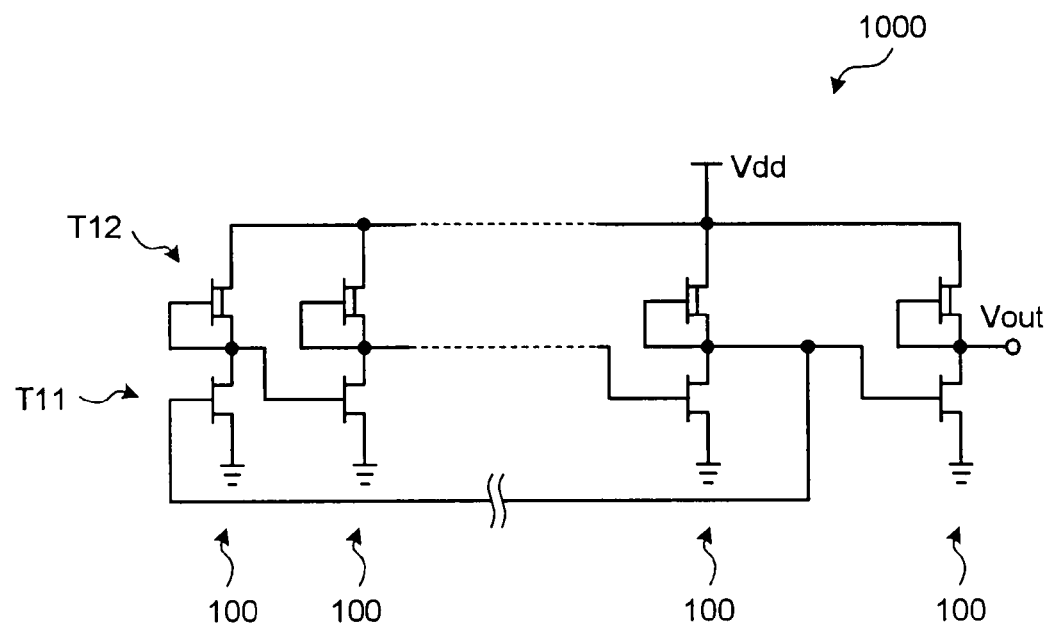
FIG. 6 is a circuit diagram of an IC element according to a sixth embodiment of the present invention.

FIG. 6 is a circuit diagram of an IC element 1000 according to a sixth embodiment of the present invention. The IC element 1000 is a direct-coupled FET logic (DFCL) ring oscillator by integrating any odd number of the ED inverter circuits 100 according to the first embodiment and connecting the ED inverter circuits 100 in a ring form. Each of the ED inverter circuits 100 includes the transistor T11 that is an enhancement-type MOSFET and the transistor T12 that is a depletion-type HEMT. $V_{DD}$ is a source voltage, and Vout is an output voltage. The ED inverter circuits 100 used in the IC element 1000 allow the IC element 1000 to be a ring oscillator having high controllability of characteristics such as a delayed time and high reliability at the high temperature.

It is allowable to apply the cap layer of the ED inverter circuit according to the second embodiment or the spacer layer of the ED inverter circuit according to the fifth embodiment to an ED inverter circuit according to any one of the embodiments. Any IC element that includes an ED inverter circuit according to any one of the embodiments can be used as an embodiment of the present invention.

As described above, according to an aspect of the present invention, it is possible to realize an ED inverter circuit and an integrated-circuit element with high controllability and high reliability at a high temperature.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An enhancement/depletion inverter circuit comprising:
   a first semiconductor layer formed with a first nitride-based compound semiconductor with a smaller bandgap on a substrate;
   a second semiconductor layer formed with a second nitride-based compound semiconductor with a wider bandgap on the first semiconductor layer, the second semiconductor layer including a first opening at a predetermined position;
   a gate insulating layer formed on a portion of the first semiconductor layer exposed through the first opening;
   a first gate electrode formed on the gate insulating layer;
   a first source electrode and a first drain electrode formed at predetermined positions on the second semiconductor layer across the first gate electrode, the first source electrode and the first drain electrode making an ohmic contact to the second semiconductor layer;
   a second gate electrode formed on the second semiconductor layer, the second gate electrode making a Schottky contact to the second semiconductor layer; and
   a second source electrode and a second drain electrode formed at predetermined positions on the second semiconductor layer across the second gate electrode, the second source electrode and the second drain electrode making an ohmic contact to the second semiconductor layer.

2. The enhancement/depletion inverter circuit according to claim 1, further comprising a third semiconductor layer formed with a third nitride-based compound semiconductor between the first semiconductor layer and the second semiconductor layer, the third semiconductor layer including a second opening overlapped with the first opening, wherein
   a carrier concentration of the third nitride-based compound semiconductor is lower than a carrier concentration of the first nitride-based compound semiconductor.

3. The enhancement/depletion inverter circuit according to claim 2, further comprising a spacer layer that is formed with aluminum nitride between either one of the first semiconductor layer the third semiconductor layer and the second semiconductor layer, the spacer layer including a third opening overlapped with the first opening.

4. The enhancement/depletion inverter circuit according to claim 1, further comprising a cap layer formed between the second semiconductor layer and at least one of the first source electrode, the first drain electrode, the second source electrode, and the second drain electrode, wherein a carrier concentration of the cap layer is higher than a carrier concentration of the second semiconductor layer.

5. The enhancement/depletion inverter circuit according to claim 2, further comprising a cap layer formed between the second semiconductor layer and at least one of the first source electrode, the first drain electrode, the second source electrode, and the second drain electrode, wherein a carrier concentration of the cap layer is higher than a carrier concentration of the second semiconductor layer.

6. The enhancement/depletion inverter circuit according to claim 3, further comprising a cap layer formed between the second semiconductor layer and at least one of the first source electrode, the first drain electrode, the second source electrode, and the second drain electrode, wherein a carrier concentration of the cap layer is higher than a carrier concentration of the second semiconductor layer.

7. An enhancement/depletion inverter circuit comprising:
a first semiconductor layer formed with a first nitride-based compound semiconductor with a smaller bandgap on a substrate;
a second semiconductor layer formed with a second nitride-based compound semiconductor with a wider bandgap on the first semiconductor layer, the second semiconductor layer including a first opening at a predetermined position;
a third semiconductor layer formed with a third nitride-based compound semiconductor using an epitaxial growth on a portion of the first semiconductor layer exposed through the first opening;
a gate insulating layer formed on the third semiconductor layer;
a first gate electrode formed on the gate insulating layer;
a first source electrode and a first drain electrode formed at predetermined positions on the second semiconductor layer across the first gate electrode, the first source electrode and the first drain electrode making an ohmic contact to the second semiconductor layer;
a second gate electrode formed on the second semiconductor layer, the second gate electrode making a Schottky contact to the second semiconductor layer; and
a second source electrode and a second drain electrode formed at predetermined positions on the second semiconductor layer across the second gate electrode, the second source electrode and the second drain electrode making an ohmic contact to the second semiconductor layer.

8. The enhancement/depletion inverter circuit according to claim 7, further comprising a fourth semiconductor layer formed with a fourth nitride-based compound semiconductor between the first semiconductor layer and the second semiconductor layer, the fourth semiconductor layer including a second opening overlapped with the first opening, wherein a carrier concentration of the fourth nitride-based compound semiconductor is lower than a carrier concentration of the first nitride-based compound semiconductor.

9. The enhancement/depletion inverter circuit according to claim 8, further comprising a spacer layer that is formed with aluminum nitride between either one of the first semiconductor layer the fourth semiconductor layer and the second semiconductor layer, the spacer layer including a third opening overlapped with the first opening.

10. The enhancement/depletion inverter circuit according to claim 7, further comprising a cap layer formed between the second semiconductor layer and at least one of the first source electrode, the first drain electrode, the second source electrode, and the second drain electrode, wherein a carrier concentration of the cap layer is higher than a carrier concentration of the second semiconductor layer.

11. The enhancement/depletion inverter circuit according to claim 8, further comprising a cap layer formed between the second semiconductor layer and at least one of the first source electrode, the first drain electrode, the second source electrode, and the second drain electrode, wherein a carrier concentration of the cap layer is higher than a carrier concentration of the second semiconductor layer.

12. The enhancement/depletion inverter circuit according to claim 9, further comprising a cap layer formed between the second semiconductor layer and at least one of the first source electrode, the first drain electrode, the second source electrode, and the second drain electrode, wherein a carrier concentration of the cap layer is higher than a carrier concentration of the second semiconductor layer.

13. An integrated circuit element comprising:
an enhancement/depletion inverter circuit including
a first semiconductor layer formed with a first nitride-based compound semiconductor with a smaller bandgap on a substrate,
a second semiconductor layer formed with a second nitride-based compound semiconductor with a wider bandgap on the first semiconductor layer, the second semiconductor layer including a first opening at a predetermined position,
a gate insulating layer formed on a portion of the first semiconductor layer exposed through the first opening,
a first gate electrode formed on the gate insulating layer,
a first source electrode and a first drain electrode formed at predetermined positions on the second semiconductor layer across the first gate electrode, the first source electrode and the first drain electrode making an ohmic contact to the second semiconductor layer,
a second gate electrode formed on the second semiconductor layer, the second gate electrode making a Schottky contact to the second semiconductor layer, and
a second source electrode and a second drain electrode formed at predetermined positions on the second semiconductor layer across the second gate electrode, the second source electrode and the second drain electrode making an ohmic contact to the second semiconductor layer.

14. An integrated circuit element comprising:
an enhancement/depletion inverter circuit including
a first semiconductor layer formed with a first nitride-based compound semiconductor with a smaller bandgap on a substrate,
a second semiconductor layer formed with a second nitride-based compound semiconductor with a wider bandgap on the first semiconductor layer, the second semiconductor layer including a first opening at a predetermined position,
a third semiconductor layer formed with a third nitride-based compound semiconductor using an epitaxial growth on a portion of the first semiconductor layer exposed through the first opening,
a gate insulating layer formed on the third semiconductor layer,
a first gate electrode formed on the gate insulating layer;
a first source electrode and a first drain electrode formed at predetermined positions on the second semiconductor layer across the first gate electrode, the first source electrode and the first drain electrode making an ohmic contact to the second semiconductor layer, a second gate electrode formed on the second semiconductor layer, the second gate electrode making a Schottky contact to the second semiconductor layer, and a second source electrode and a second drain electrode formed at predetermined positions on the second semiconductor layer across the second gate electrode, the second source electrode and the second drain electrode making an ohmic contact to the second semiconductor layer.

* * * * *